United States Patent
Hamanaka (10) Patent No.: US 8,723,561 B2
(45) Date of Patent: May 13, 2014

(54) DRIVE CIRCUIT FOR SWITCHING ELEMENT

(71) Applicant: Denso Corporation, Kariya (JP)

(72) Inventor: Yoshiyuki Hamanaka, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/736,151

(22) Filed: Jan. 8, 2013

(65) Prior Publication Data

US 2013/0181749 A1 Jul. 18, 2013

(30) Foreign Application Priority Data

Jan. 12, 2012 (JP) .................................. 2012-003740

(51) Int. Cl.
*H03K 3/00* (2006.01)
(52) U.S. Cl.
USPC .............................. 327/108; 327/423; 327/588
(58) Field of Classification Search
USPC ............................................ 327/108, 423, 588
See application file for complete search history.

(56) References Cited

U.S. PATENT DOCUMENTS 7,969,225 B2 * 6/2011 Ho et al. ........................ 327/423

FOREIGN PATENT DOCUMENTS

| JP | 9-23664 | 1/1997 |
|---|---|---|
| JP | 11-252896 | 9/1999 |
| JP | 3339311 | 8/2002 |
| JP | 2010-283973 | 12/2010 |

OTHER PUBLICATIONS

Office Action (2 pgs.) dated Dec. 17, 2013 issued in corresponding Japanese Application No. 2012-003740 with an at least partial English-language translation thereof (2 pgs.).

* cited by examiner

*Primary Examiner* — Kenneth B. Wells
(74) *Attorney, Agent, or Firm* — Nixon & Vanderhye P.C.

(57) ABSTRACT

The drive circuit is for turning on and off a switching element having an open/close control terminal, an input terminal and an output terminal by moving electrical charge in the open/close control terminal in accordance with an on-manipulation command and an off-manipulation command received from outside. The drive circuit includes an active gate control means for changing a moving speed of the electrical charge midway between when movement of the electrical charge is started and when the movement is completed, and a determination means for making at least one of a determination on a change timing to change the moving speed and a determination on whether or not a change of the moving speed by the active gate control means should be made.

11 Claims, 5 Drawing Sheets

DRIVE CIRCUIT FOR SWITCHING ELEMENT

This application claims priority to Japanese Patent Application No. 2012-3740 filed on Jan. 12, 2012, the entire contents of which are hereby incorporated by reference.

BACKGROUND OF THE INVENTION

1. Field of the Invention

The present invention relates to a drive circuit for a switching element.

2. Description of Related Art

As described in Japanese Patent No. 3339311, there is known the so-called active gate control technique where the charge/discharge rate of the gate (electric charge in the gate) of an IGBT (Insulated Gate Bipolar Transistor) used as a semiconductor switching element is changed during a period from when charge/discharge of the gate is started to when the charge/discharge of the gate is completed. In more detail, the gate of the switching element is connected with a pair of first charge/discharge paths having a low resistance and a second pair of charge/discharge paths having a high resistance. The switching element is provided with an auxiliary emitter terminal from which a small current proportional to the collector current of the switching element is outputted. The auxiliary emitter terminal and the emitter of the switching element are connected to each other through an inductance.

In this technique, the process of discharging the gate is performed such that the gate is discharged through the pair of the first charge/discharge paths having the low resistance, and thereafter, when it is detected that the current flowing through the inductance starts to decrease due to reduction of the collector current, the gate is discharged through the pair of the second charge/discharge paths having the high resistance. According to the above described technique, it is possible to reduce the switching loss while suppressing increase of the surge voltage occurring when the operating state of the switching element is changed from on to off or vice versa.

Incidentally, the level of the collector-emitter voltage (the voltage across the collector and emitter of the switching element) at the time when the operating state of the switching element is changed greatly affects the switching loss and the reliability of the switching element. The level of the collector-emitter voltage varies due to various factors including the collector current.

In the above described technique, the rate of discharging the gate is changed at the moment when the current flowing through the inductance starts to decrease without exception, although the level of the collector-emitter voltage varies due to various factors. Hence, the above described technique involves various problems.

For example, when the collector current is large, the surge voltage becomes considerably high because the timing to reduce the gate discharging rate is late for this large collector current. This may cause the collector-emitter voltage to increase, and cause the switching loss to increase. For another example, it may occur that the gate charging/discharging rate is changed by the active gate control although there is a sufficient margin between the collector-emitter voltage and its allowable upper limit due to transition of the operation state of the switching element. In this case, the switching loss may increase because of reduction of the switching speed.

SUMMARY

An exemplary embodiment provides a drive circuit for turning on and off a switching element having an open/close control terminal, an input terminal and an output terminal by moving electrical charge in the open/close control terminal in accordance with an on-manipulation command and an off-manipulation command received from outside, including:

an active gate control means for changing a moving speed of the electrical charge midway between when movement of the electrical charge is started and when the movement is completed; and a determination means for making at least one of a determination on a change timing to change the moving speed and a determination on whether or not a change of the moving speed by the active gate control means should be made based on at least one a terminal voltage of a DC power source applied to the input terminal of the switching element, a current flowing through the input and output terminals of the switching element and a temperature of the switching element.

According to the exemplary embodiment, there is provided a drive circuit for a switching element, which is capable of performing active gate control while suppressing the surge voltage and switching loss of the switching element.

Other advantages and features of the invention will become apparent from the following description including the drawings and claims.

PREFERRED EMBODIMENTS OF THE INVENTION

First Embodiment

Figure 1:
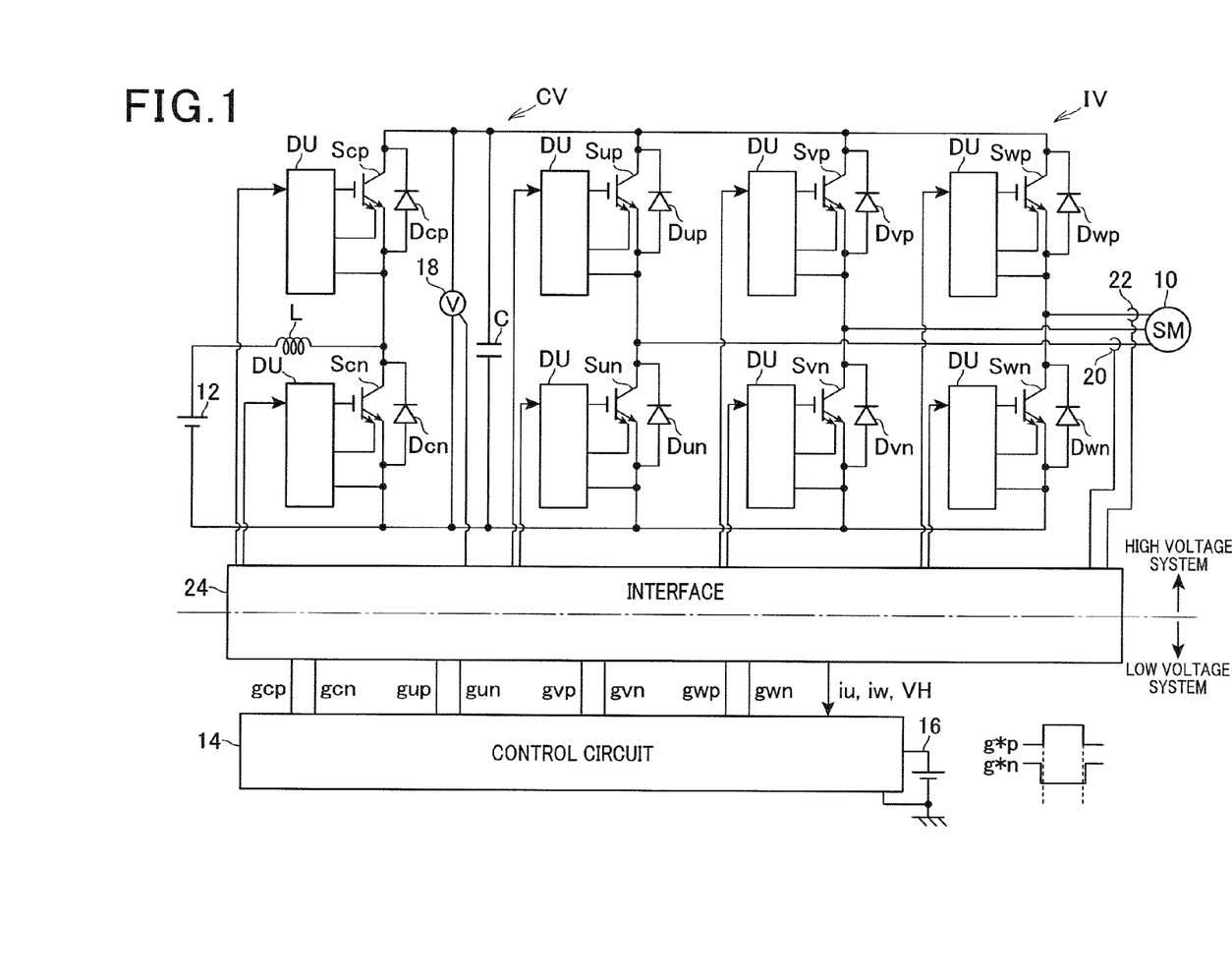
FIG. 1 is a diagram showing a structure of a power conversion apparatus including drive units as drive circuits for switching elements according to a first embodiment of the invention.

FIG. 1 is a diagram showing a structure of a power conversion apparatus including drive units as drive circuits for switching elements according to a first embodiment of the invention.

In FIG. 1, the reference numeral 10 denotes a motor-generator which is mounted on a vehicle as a main engine. The motor-generator 10 is coupled to drive wheels (not shown) of the vehicle. The motor-generator 10 is electrically connected to a high voltage battery 12 through an inverter IV and a step-up converter CV.

The step-up converter CV includes a capacitor CV, a pair of switching elements Scp and Scn parallel-connected to the capacitor C, and a reactor L connecting the connection node of the switching elements Scp and Scn to the positive terminal of the high voltage battery 12. The step-up converter CV has a function to step up the output voltage (288 V, for example) of the high voltage battery 12 to a predetermined voltage (666 V, for example) by turning on and off the switching element Scp and Scn.

The inverter IV includes a first series connection of switching element Sup and Sun, a second series connection of switching element Svp and Svn and a third series connection of switching element Swp and Swn. The connection nodes of the first to third series connections are connected to U, V and W phases of the motor-generator 10, respectively.

In this embodiment, as the above switching elements S*# (*=c,u,v,w; #=p,n), voltage-controlled type transistors such as IGBTs (Insulated Gate Bipolar Transistors) are used. The switching elements S*# are inversely parallel-connected with freewheel diodes D*#, respectively. A current detecting circuit is provided for each of the switching elements S*# to directly detect the collector current, that is, the current flowing through the input terminal (collector) and the output terminal (emitter)

The reference numeral 14 denotes a control circuit which is powered by a low voltage battery 16 to control the inverter IV and the step-up converter CV in order that a controlled variable (torque, for example) of the motor-generator 10 is kept at a desired value. More specifically, the control circuit 14 takes in detection signals outputted from a voltage sensor 18 for detecting the input voltage VH of the inverter IV (the voltage of the capacitor C), and current sensors 20 and 22 for detecting the U-phase current iu and the W-phase current iw of the motor-generator 10, respectively. The control circuit 14 generates manipulation signals gcp and gcn based on the detection signals, which are outputted to the drive units DU for manipulating the switching elements Scp and Scn to control the output voltage of the step-up converter CV at a desired voltage. The control circuit 14 generates also manipulation signals gup, gun, gyp, gvn, gwp and gwn based on the detection signals, which are outputted to the drive units DU for manipulating the switching element Sup, Sun, Svp, Svn, Swp and Swn. Here, the manipulation signal g*p applied to the high-potential side switching element S*p and the manipulation signal g*n applied to the low-potential side switching element S*n are in a complementary relationship. That is, the high-potential side switching element S*p and the low-potential side switching element S*n are turned on alternately.

In this embodiment, a high voltage system including the high voltage battery 12 and a low voltage system including the low voltage battery 16 are insulated from each other. Signal transmission between the high voltage system and the low voltage system is performed through an interface 24 including insulating elements such as photocouplers. In more detail, the detection signals outputted from the voltage sensor 18, the current sensors 20 and 22 and the current detecting circuits are transmitted form the high voltage system to the low voltage system through the interface 24. On the other hand, the manipulation signals g*# are transmitted from the low voltage system to the high voltage system through the interface 24.

Next, the structure of the drive unit DU is explained with reference to FIG. 2.

Figure 2:
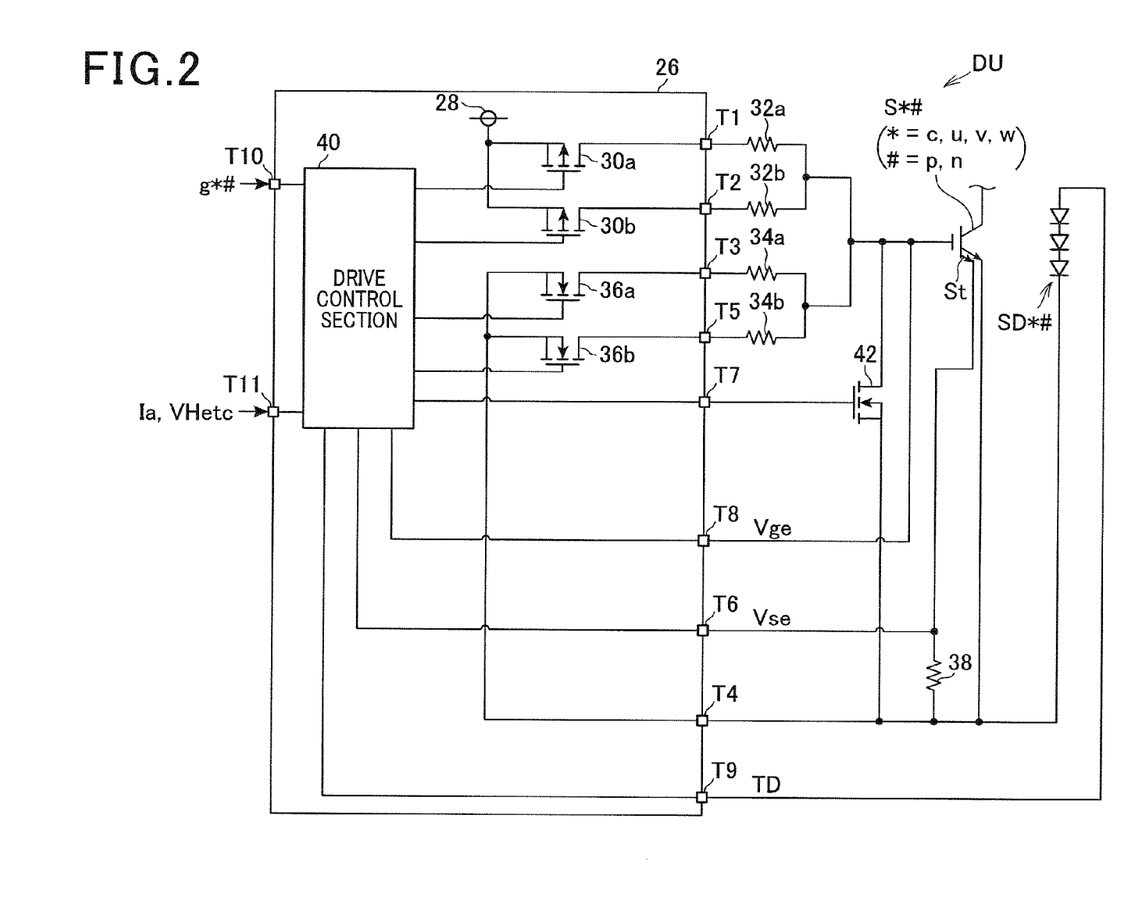
FIG. 2 is a diagram showing a structure of the drive unit.

As shown in FIG. 2, the drive unit DU includes a drive IC 26 which is a one-chip IC, and a constant voltage source 28 generating a voltage to be applied to the on/of control terminal (gate) of the switching element S*#.

The constant voltage source 28 is connected to a terminal T1 of the drive IC 26 through a P-channel MOSFET 30a as a first charge switching element. The terminal T1 is connected to the gate of the switching element S*# through a first charge resistor 32a. The constant voltage source 28 is connected to also a terminal T2 of the drive IC 26 through a P-channel MOSFET 30b as a second charge switching element. The terminal T2 is connected to the gate of the switching element S*# through a second charge resistor 32b.

The gate of the switching element S*# is connected to a terminal T3 of the drive IC 26 through a first discharge resistor 34a. The terminal T3 is connected to a terminal T4 through an N-channel MOSFET 36a as a first discharge switching element. The gate of the switching element S*# is connected to also a terminal T5 through a second discharge resistor 34b. The terminal T5 is connected to the terminal T4 through an N-channel MOSFET 36b as a second discharge switching element. The terminal T4 is connected to the emitter of the switching element S*#.

The resistances of the first charge resistor 32a and the second charge resistor 32b may be the same with or different from each other. The resistances of the first discharge resistor 34a and second discharge resistor 34b may be the same with or different from each other.

The switching element S*# is provided with a sense terminal St from which a small current proportional to the collector current thereof is outputted. The sense terminal St is connected to the emitter of the switching element S*# through a resistor 38. Accordingly, since a voltage drop occurs across the resistor 38 due to the small current flowing from the sense terminal St, the potential of the resistor 38 on the side of the sense terminal St (referred to as the sense voltage Vse hereinafter) can be used as an electrical state quantity having a correlation with the collector current. The sense voltage Vse is received by a drive control section 40 of the drive IC 26 through a terminal T6.

A temperature-sensing diode SD*# is disposed in the vicinity of the switching element S*# to detect the temperature of the switching element S*# as an element temperature TD. The temperature-sensing diode SD*# outputs a voltage depending on the temperature of the switching element S*#. The output voltage of the temperature-sensing diode SD*# and the temperature of the Switching element S*# are in a negative correlation. The output voltage of the temperature-sensing diode SD*# is received by the drive control section 40 through the terminal T9. The drive control section 40 monitors the element temperature TD based on the output voltage of the temperature-sensing diode SD*#.

The drive IC 26 is provided with a terminal T11 for taking in the detection signal indicative of the input voltage VH of the inverter IV outputted from the voltage sensor 18, and the detection signal indicative of the collector current Ia outputted from the current detecting circuit, which are transmitted from the control circuit 14 of the low voltage system to be received by the drive control circuit 40.

The drive unit DU includes an N-channel MOSFET 42 as an off-holding switching element for making a short circuit between the gate and emitter of the switching element S*#. The off-holding switching element 42 is disposed as near to the switching element S*# as possible so that the gate and emitter of the switching element S*# are connected to each other with low resistance. The resistance of the discharge path including the off-holding switching element 42 for making connection between the gate and emitter of the switching element S*# is lower than those of the discharge paths including the first discharge resistor 34a and the second discharge resistor 34b, respectively. The reason for that is to prevent the switching element S*# from being turned on accidentally due to high-frequency noise applied to the gate through a parasitic capacitance between the gate and the collector or emitter of the switching element S*# while the switching element S*# is set off in accordance with the manipulation signal g*#.

The gate of the off-holding switching element 42 is connected to the drive control section 40 through a terminal T7. The drive control section 40 monitors the gate voltage Vge (the voltage between the gate and emitter) of the switching element S*# based on the voltage of a terminal T8 connected to the gate of the switching element S*#. The drive control section 40 performs off-holding control where the off-holding switching element 42 is turned on and off based on the gate voltage Vge and the manipulation signal g*# received through the terminal T10.

More specifically, the off-holding switching element 42 is kept off while the gate charging process is performed in response to an on-manipulation command indicated by the received manipulation signal g*#, or while the gate discharging process is performed in response to an off-manipulation command indicated by the received manipulation signal g*# and the gate voltage Vge is higher than a threshold voltage Vth. On the other hand, the off-holding switching element 42 is kept on while the gate discharging process is performed and the gate voltage Vge is lower than or equal to the threshold voltage Vth. The threshold voltage Vth is set lower than the mirror voltage of the switching element S*#.

Next, the gate charging/discharging process of the switching element S*# performed by the drive control section 40 is explained.

In this embodiment, the gate charging/discharging process includes active gate control for changing the resistance of the charge/discharge path connected to the gate of the switching element S*# midway during the period from when the gate charging/discharging is started to when it is completed. The reason for that is to suppress the surge voltage and switching loss occurring when the operation state of the switching element is switched.

More specifically, the gate charging process is such that one of the first charge switching element 30a and the second charge switching element 30b is turned off in response to the on-manipulation command indicated by the received manipulation signal g*#, to thereby set the gate charging rate to a low level. Thereafter, both the switching elements 30a and 30b are turned on to set the gate charging rate to a high level. While the gate charging process is performed, both the first and second discharge switching elements 36a and 36b are kept off.

On the other hand, the gate discharging process is such that both the first discharge switching element 36a and the second discharge switching element 36b are turned on in response to the off-manipulation command indicated by the received manipulate signal g*#, to thereby set the gate discharging rate to a high level. Thereafter, one of the first discharge switching element 36a and the second discharge switching element 36b is turned off to set the gate discharging rate to a low level. While the gate discharging process is performed, both the first and second charge switching elements 30a and 30b are kept off.

In this embodiment, a determination operation is performed to determine the timing to change the gate charging/discharging rate and so on based on the input voltage VH detected by the voltage sensor 18 to increase the effect of reduction of the switching loss and so on. Next, the gate discharging process including the determination operation is explained with reference to FIG. 3.

Figure 3:
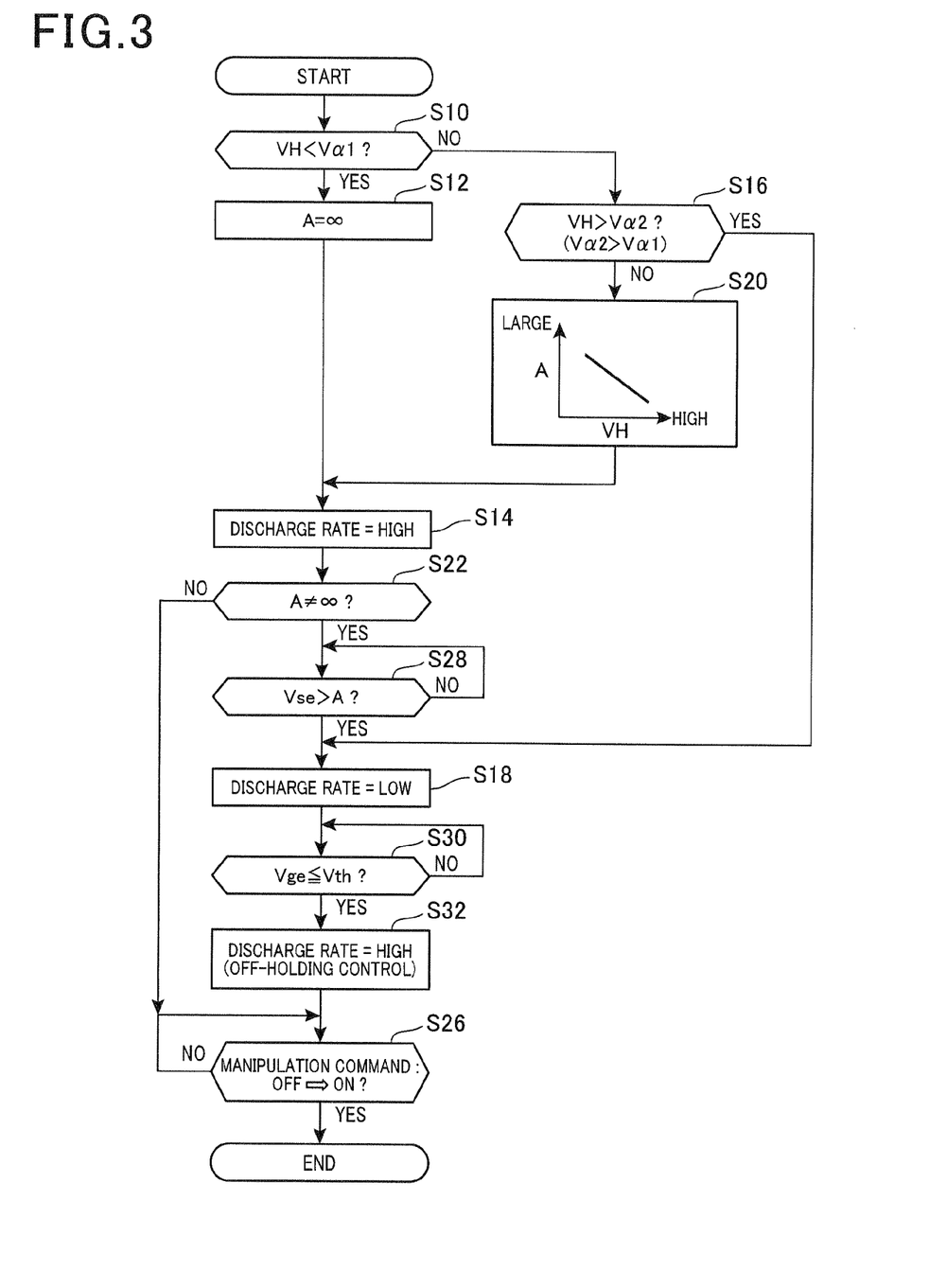
FIG. 3 is a flowchart showing steps of a gate discharging process perform by the drive unit.

A change to the off-manipulation command indicated by the manipulation signal g*# triggers the drive control section 40 to perform this process.

This process begins in step S10 to determine whether or not the input voltage VH received through the terminal T11 is lower than a first specified voltage Vα1. Step S10 is for determining whether or not the gate discharging process should be performed while keeping the gate discharging rate at the high level without performing the active gate control. In a state where the input voltage VH is low, there is a sufficient margin between the collector-emitter voltage and its allowable upper limit. Accordingly, in this state, there is no possibility that the collector-emitter voltage reaches its allowable upper limit even if the gate discharging process is performed while keeping the gate discharging rate at the high level. Here, the allowable upper limit is an upper limit of the voltage range of the collector-emitter voltage below which the switching element S*# can operate reliably.

If the determination result in step S10 is affirmative, the process proceeds to step S12 while determining that the active gate control should not be performed. In step S12, a threshold value A is set to an extremely large value. The extremely large value may be an upper limit of the range of the detected sense voltage Vse.

In subsequent step S14, both the first and second discharge switching element 36a and 36b are turned on to set the gate discharge rate to the high level.

On the other hand, if the determination result in step S10 is negative, the process proceeds to S16. In step S16, it is determined whether or not the input voltage VH exceeds a second specified voltage Vα2 which is higher than the first specified voltage Vα1. Step S16 is for determining whether or not the gate discharging process should be performed while keeping the gate discharging rate at the low level without performing the active gate control. This is because if the active control is performed when the input voltage VH is high, there may occur a situation where the collector-emitter voltage exceeds the allowable upper limit while the switching element S*# is switched from on to off. Such a situation can be avoided by setting the gate discharging rate to the low level to thereby suppress the surge voltage when the input voltage VH is high.

If the determination result in step S16 is affirmative, the process proceeds to step S18 while determining that the active gate control should not be performed. In step S18, one of the first discharge switching element 36a and the second discharge switching element 36b is turned on to set the gate discharging rate to the low level.

On the other hand, if the determination result in step S16 is negative, the process proceeds to step S20 while determining that the active gate control should be performed. In step S20, the threshold value A with which the sense voltage Vse is compared in the later described step S28 is decreased with the increase of the input voltage VH. Step S20 is for advancing the timing to change the gate discharging rate from the high level to the low level more as the input voltage VH is higher to suppress increase of the switching loss.

The collector-emitter voltage is a sum of the surge voltage and the input voltage VH during a period in which the switching element is switched to off. Accordingly, it is possible to estimate, from the input voltage VH, the margin between the collector-emitter voltage and the allowable upper limit during the period in which the switching element is switched to off. Estimating the margin makes it possible to determine the timing to change the gate discharging rate taking into account the balance between the effect of suppression of the surge voltage and the increase of the switching loss. From the above point of view, in step S20, the timing to change the gate discharging rate is variably set such that the rate of decrease of the collector current during the period in which the switching element S*# is switched from on to off is lowered with the increase of the input voltage VH.

In this embodiment, the maximum value of the threshold value A set in step S20 is the value of the sense voltage Vse at the timing when the collector-emitter voltage becomes equal to the input voltage VH during the period in which the switching element S*# is switched from on to off.

When step S20 is completed, the process proceeds to step S14. When step S14 is completed, the process proceeds to step S22 to determine whether or not the threshold value A is not set to the extremely large value.

If the determination result in step S22 is negative, the process proceeds to step S26 while determining that the gate discharging rate should be kept at the high level during the period in which the off-manipulation command is transmitted.

On the other hand, if the determination result in step S22 is negative, the process proceeds to step 28 to wait until the sense voltage Vse exceeds the threshold value A. Step S28 is for determining the timing to change the gate discharging rate.

If the determination result in step S28 is affirmative, the process proceeds to step S18 to change the gate discharging rate from the high level to the low level.

In subsequent step S30, the process waits until the gate voltage Vge is determined to be lower than or equal to the threshold voltage Vth. Step S30 is for determining whether or not it is the timing to turn on the off-holding switching element 42.

In subsequent step S32, the off-holding switching element 42 is turned on by the off-holding control. As a result, the gate discharging rate is changed from the low level to the high level.

If the determination result in step S22 is negative, or when step S32 is completed, the process proceeds to step S26. In step S26, the process waits until the manipulation signal g*# indicates a change from the off-manipulation command to the on-manipulation command.

If the determination result in step S26 is affirmative, the process is terminated while turning off the first and second discharge switching elements 36a and 36b. Incidentally, the above described determination operation may be included in the gate charging process.

In this case, a change from the off-manipulation command to the on-manipulation command triggers the determination operation. More specifically, as for the timing to change the gate charging rate, there is performed an operation to delay the timing to change the gate charging rate from the low level to the high level more as the input voltage VH is higher. That is, the timing to change the gate charging rate is variably set such that the rate of increase of the collector current during the transient from off to on states of the switching element S*# becomes lower as the input voltage VH becomes higher.

As for the active gate control, the gate charging is performed while setting the charging rate to the high level if the input voltage VH is determined to be lower than the first specified voltage Vα1, and performed while setting the charging rate to the low level if the input voltage VH is determined to be higher than the second specified voltage Vα2.

According the above determination operation, it is possible to suppress the surge voltage due to the recovery current flowing through the freewheel diode inversely parallel-connected to one of the switching elements S*p and S*n series connected to each other when the other of these switching elements S*p and S*n is turned on. This makes it possible to prevent the collector-emitter voltage from becoming excessively high.

Figure 4:
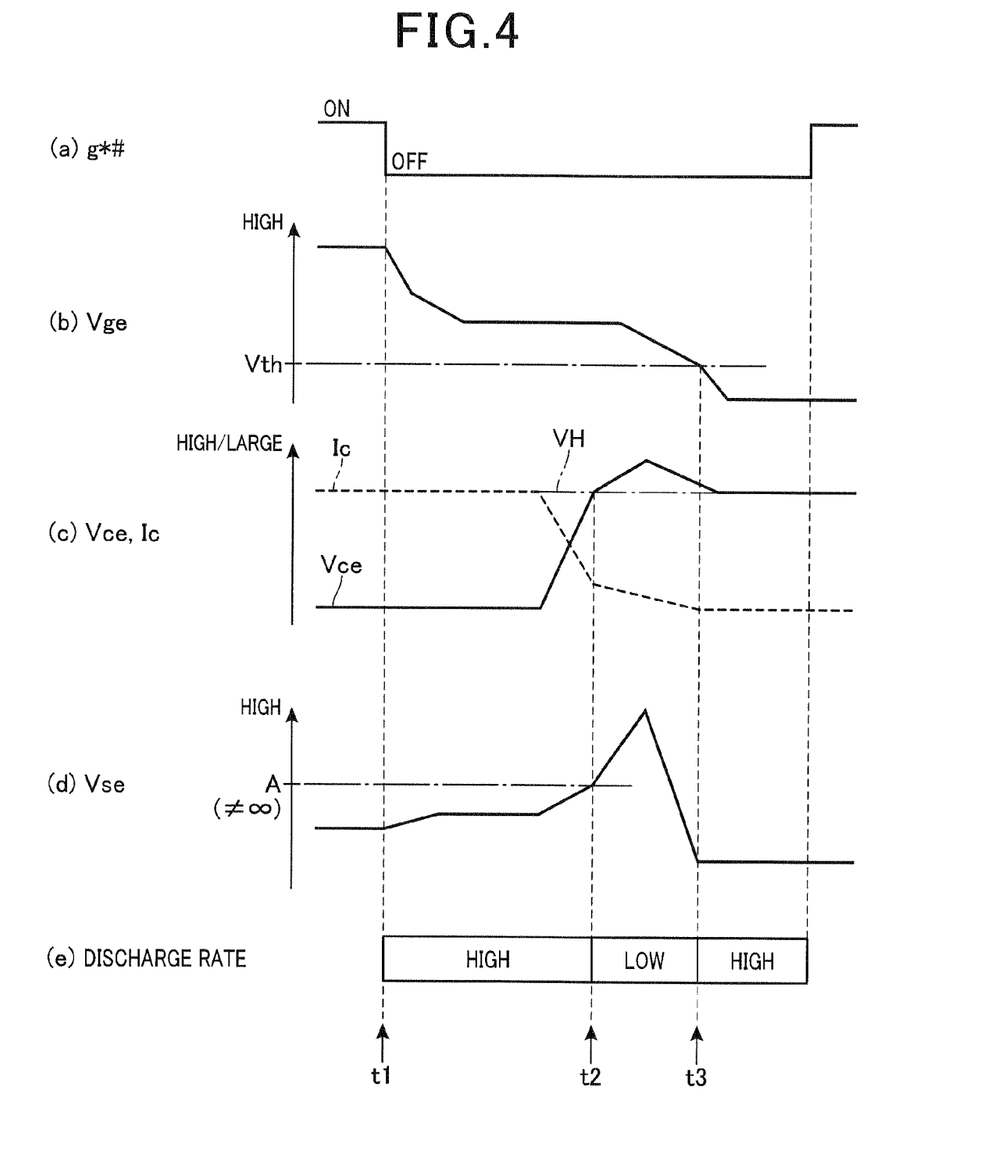
FIG. 4 is a diagram showing an example of a time chart of the gate charging process performed by the drive unit.

FIG. 4 shows an example of a time chart of the gate discharging process when the active gate control is performed. In FIG. 4, section (a) shows transition of the manipulation signal g*# inputted to the drive control section 40, section (b) shows transition of the gate voltage Vge, section (c) shows transition of the collector-emitter voltage Vce, section (d) shows transition of the sense voltage Vse and section (e) shows transition of the gate discharging rate.

In this example, the gate discharging process starts to be performed while setting the discharging rate to the high level at time t1 when the manipulation signal g*# is changed from the on-manipulation command to the off-manipulation command. As a result, the gate voltage Vge starts to decrease.

Thereafter, the gate discharging rate is changed from the high level to the low level by the active gate control at time t2 when the sense voltage Vse exceeds the threshold value A. In this example, the threshold value A is set to the maximum of its range settable in step S20 of the process shown in FIG. 3.

Thereafter, the gate discharging rate is changed from the high level to the low level by the off-holding control at time t3 when the gate voltage Vge falls below the threshold voltage Vth.

According to the first embodiment described above, the following advantages are provided.

(1) The timing to change the gate charging/discharging rate is variably set such that the rate of change of the collector current decreases more as the input voltage VH is higher during the transition period of the operating state of the switching element S*#. This makes it possible to prevent the collector-emitter voltage of the switching element S*# from becoming excessively high, to thereby suppress increase of the switching loss and degradation of the reliability of the switching element S*#.

(2) The gate charging/discharging process is performed keeping the gate charging/discharging rate at the high level without performing the active gate control when the input voltage VH is determined to be lower than the first specified voltage Vα. This makes it possible to suppress increase of the switching loss.

(3) The gate charging/discharging process is performed keeping the gate charging/discharging rate at the low level without performing the active gate control when the input voltage VH is determined to be higher than the second specified voltage Vα2. This makes it possible to prevent the gate-emitter voltage of the switching element S*# from becoming excessively high.

(4) The timing to change the gate charging/discharging rate is determined based on the sense voltage Vse. This makes it possible to structure the circuit for determining the timing to change the gate charging/discharging rate within the high voltage system. This makes it unnecessary to increase the circuit scale of the drive unit DU.

Second Embodiment

Next, a second embodiment of the invention is described with a focus on the difference with the first embodiment.

Figure 5:
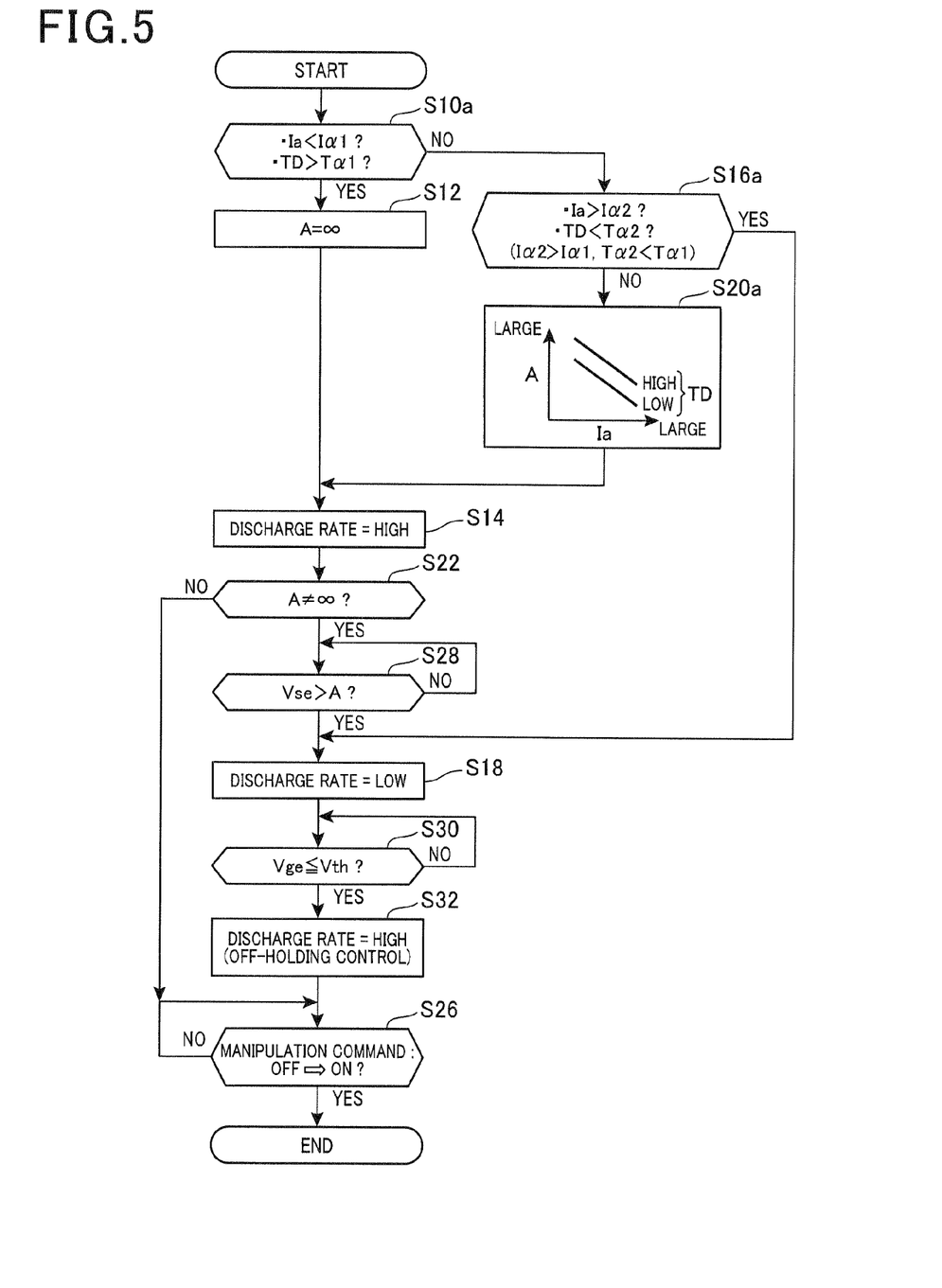
FIG. 5 is a flowchart showing steps of a gate discharging process perform by the drive unit as a second embodiment of the invention.

In the second embodiment, the determination operation is performed based on the collector current Ia detected by the current detecting circuit and the element temperature TD detected by the temperature-sensing diode SD*#.

FIG. 5 is a flowchart showing steps of the gate discharging process including the determination operation performed in this embodiment. A change to the off-manipulation command indicated by the manipulation signal g*# triggers the drive control section 40 to perform this gate discharging process. In FIG. 5, the same steps as those in FIG. 3 are denoted by the same step numbers.

This process begins in step S10a where it is determined whether or not the logical product of the condition (a) and the condition (b) is true; (a) the collector current Ia obtained through the terminal T11 is below a first specified current Iα1, (b) the element temperature TD exceeds a first specified temperature Tα1. Step S10a, which is a step having the same purpose as step S10, is performed when it is assumed that the collector-emitter voltage will not reach its allowable upper limit. This is because, the rate of decrease of the collector current during the transient period from on to off of the switching element S*# and the surge voltage become lower as the collector current becomes smaller. Further, the rate of decrease of the collector current during the transient period and the surge voltage become lower as the element temperature TD becomes higher. Accordingly, it can be assumed that the margin between the collector-emitter voltage and its allowable upper limit is sufficiently large when the collector current Ia is small and the element temperature TD is high.

If the determination result in step S10a is affirmative, the process proceeds to step S12 while determining that the active gate control should not performed.

On the other hand, if the determination result in step S10a is negative, the process proceeds to step S16a where it is determined whether or not the logical product of the two conditions (c) and (d) is true; (c) the collector current Ia exceeds a second specified current $I\alpha 2$ which is higher than the first specified current $I\alpha 1$, (d) the element temperature TD is below a second specified temperature $T\alpha 2$ which is lower than the first specified temperature $I\alpha 1$. Step S16a is a step performed for the same purpose as step S16 in the process shown in FIG. 3. If the determination result in step S16a is affirmative, the process proceeds to step S18 while determining that the active gate control shod not be performed.

If the determination result in step S16a is negative, the process proceeds to step S20a. In step S20a, the threshold value A is set to a value which decreases with the increase of the collector current Ia. In this step, the set threshold value A is increased with the increase of the element temperature TD. This is because the timing to change the gate discharging rate from the high level to the low level has to be advanced more as the collector current Ia becomes larger or as the element temperature TD becomes lower. In accordance with such an operation, the timing to change the discharging rate can be variably set in accordance with both the collector current Ia and the element temperature TD as parameters affecting the rate of decrease of the collector current. This makes it possible to improve the accuracy of adjustment for the difference between the collector-emitter voltage and its allowable upper limit when the switching element S*# is turned off, to thereby set the timing to change the discharging rate to increase the effect of reduction of the switching loss more effectively. After completion of step S20a, the process proceeds to step S14.

If the determination result in step S26 is affirmative, the process is terminated.

Incidentally, the determination operation as described in the first embodiment can be included in the charging process performed in the second process. In this case, as for the timing to change the gate charging rate, there is performed an operation where the timing to change the gate charging timing from the low level to the high level is delayed more as the collector current Ia is larger or the element temperature TD is lower. As for the active gate control, charging of the gate is performed while setting the gate charging rate to the high level if the collector current Ia is determined to be smaller than the first specified current $I\alpha 1$ and the element temperature TD is determined to be higher than the first specific temperature $T\alpha 1$, and performed while setting the gate charging rate at the low level if the collector current Ia is determined to be higher than the second specified current $I\alpha 2$ and the element temperature TD is determined to be lower than the second specified temperature $T\alpha 2$. Each of the thresholds $I\alpha 1$, $I\alpha 2$, $T\alpha 1$ and $T\alpha 2$ for determining whether or not the active gate control should be performed may be set differently for the charging process and for the discharging process. This is because the behavior of the collector current differs between when the switching element S*# is switched from off to on and when the switching element S*# is switched from on to off.

As described above, according to the second embodiment, since the determination operation is performed based on both the collector current Ia and the element temperature TD, it is possible to suppress increase of the surge voltage and the switching loss more effectively.

Other Embodiments

It is a matter of course that various modifications can be made to the above described embodiments as described below.

The control logic of the first embodiment is for making both a determination on the timing to change the gate discharging rate by the active gate control and a determination on whether or not the active gate control should be performed. However, the control logic of the first embodiment may be such as to make only the determination on whether or not the active gate control should be performed. In this case, steps S10, S12, S16 and S22 are removed from the process shown in FIG. 3.

The way to change the moving speed of the gate charge (the gate charging/discharging rate) may be other than that described in the above embodiment.

For example, the gate charging rate may be changed in accordance with the way described in the following. The resistance of the first charge resistor 32a is set larger than that of the second charge resistor 32b. To set the gate charging rate to the low level, the second charge switching element 30b is turned off while the first charge switching element 30a is on. To set the gate charging rate to the high level, the second charge switching element 30b is turned on while the first charge switching element 30a is off.

Likewise, the gate discharging rate may be changed in accordance with the way described in the following. The resistance of the first discharge resistor 34a is set larger than that of the second discharge resistor 34b. To set the gate discharging rate to the low level, the second discharge switching element 36b is turned off while the first discharge switching element 36a is on. To set the gate discharging rate to the high level, the second discharge switching element 30b is turned on while the first discharge switching element 36a is off.

The circuit structure for charging and discharging the gate is not limited to the one shown in FIG. 2. It may be such as to enable performing the active gate control for one of the gate discharging and the gate charging.

The first embodiment may be modified not to perform the off-holding control. In this case, steps S30 and S32 are removed from the process shown in FIG. 3. That is, in this case, the gate discharging rate is kept at the low level after time t2.

The parameters used for determining the timing to change the gate charging/discharging timing and determining whether or not the active gate control should be performed are not limited to the ones described in the above embodiments. For example, such determinations may be made based on only the element temperature TD as a sole parameter, if the effect of the element temperature TD on the surge voltage during transition of the operating state of the switching element S*# is comparable with that of the collector current. For another example, such determinations may be made based on two of the input voltage VH, the collector current Ia and the element temperature TD (except the combination of the collector current Ia and the element temperature TD). That is, the input voltage VH may be additionally used as a parameter in the second embodiment. In this case, the detection accuracy of the collector-emitter voltage during transition of the operating state of the switching element S*# can be further increased, and the effect of reduction of the switching loss can be further increased while preventing degradation of the reliability of the switching element S*#.

In place of the collector current Ia, the output current of the sense terminal St or the sense voltage Vse having a correlation with the collector current Ia may be used as the parameter. In this case, advancing the timing to change the gate discharging rate more as the sense voltage Vse is higher when the switching element S*# is turned to on is involved in advancing the timing to change the gate discharging rate more as the collector current Ia is larger. Likewise, discharging the gate at the rate set to the high level if the sense voltage Vse is lower than a predetermined voltage when the switching element S*# is turned on is involved in discharging the gate at the rate set to the high level if the collector current Ia is smaller than the first specified current. Incidentally, in this case, the output current or the sense voltage Vse is used in place of the collector current Ia in steps S10, S16a and S20a in the process shown in FIG. 5.

The first embodiment may be modified such that the process shown in FIG. 3 is performed by the control circuit 14 instead of the drive control section 40 of the drive unit DU.

In the first embodiment, the threshold value A is decreased continuously as the the input voltage VH increases. However, the threshold value A may be decreased stepwise with the increase of the input voltage VH.

The parameter used to determine the timing to change the moving speed of the gate charge (the gate charging/discharging rate) is not limited to the sense voltage Vse. For example, it may be the manipulation signal g*#, collector current Ia, gate voltage Vge, or collector-emitter voltage Vce. In a case where the manipulation signal g*# is used, as for the gate discharging process, step S20 included in the process shown in FIG. 3 is replaced by a step for shortening the specified time more as the input voltage VH is higher. In this case, a timing after lapse of the specified time from the timing at which a change to the off-manipulation command is determined to have been made may be determined as the change timing. In a case where the gate voltage Vge is used, as for the gate discharging process, a timing after lapse of the specified time from the timing at which the gate voltage Vge starts to decrease may be determined as the change timing.

The number of times to increase or decrease the moving speed of the gate charge is not limited to two. It may be three or more.

The way to detect the element temperature TD is not limited to the one using the temperature-sensing diode SD*#. For example, the element temperature TD may be detected using a thermistor disposed in the vicinity of the switching element S*#.

The above embodiments may be modified such that the signal indicative of the input voltage VH detected by the voltage sensor 18 and the signal indicative of the collector current Ia detected by the current detecting circuit are directly inputted to the drive control section 40 not through the low voltage system.

The switching elements may be MOSFETs.

In the first embodiment, the high voltage battery 12 may serve as the DC power supply when the step-up converter CV is not driven, or when the inverter IV is directly connected to the high voltage battery 12.

The present invention can be used for a power conversion apparatus other than a vehicle-mounted power conversion apparatus. Further, the present invention can be used for a switching apparatus other than a power conversion apparatus.

The above explained preferred embodiments are exemplary of the invention of the present application which is described solely by the claims appended below. It should be understood that modifications of the preferred embodiments may be made as would occur to one of skill in the art.

What is claimed is:

1. A drive circuit for turning on and off a switching element having an open/close control terminal, an input terminal and an output terminal by moving electrical charge in the open/close control terminal in accordance with an on-manipulation command and an off-manipulation command received from outside, comprising:
   an active gate control means for changing a moving speed of the electrical charge midway between when movement of the electrical charge is started and when the movement is completed; and
   a determination means for making at least one of a determination on a change timing to change the moving speed and a determination on whether or not a change of the moving speed by the active gate control means should be made based on at least one a terminal voltage of a DC power source applied to the input terminal of the switching element, a current flowing through the input and output terminals of the switching element and a temperature of the switching element.

2. The drive circuit according to claim 1, wherein the determination means is configured to variably set the change timing such that a rate of change of the current flowing through the input and output terminals is lower as the terminal voltage of the DC power source is higher during a transient period of an operating state of the switching element.

3. The drive circuit according to claim 1, wherein the active gate control means is configured to operate to change the moving speed from one of a high level and a low level to the other of the high level and the low level, and the determination means is configured to determine that the electrical charge should be moved keeping the moving speed at the high level without causing the active gate control means to change the moving speed when the terminal voltage of the DC voltage source is lower than a first specified voltage.

4. The drive circuit according to claim 3, wherein the determination means is configured to determine that the electrical charge should be moved keeping the moving speed at the low level without causing the active gate control means to change the moving speed when the terminal voltage of the DC power source exceeds a second specific voltage higher than the first specified voltage.

5. The drive circuit according to claim 1, wherein the determination means is configured to advance the change timing more as the current flowing through the input and output terminals is larger when the switching element is turned to on.

6. The drive circuit according to claim 1, wherein the active gate control means is configured to operate to change the moving speed from a high level to a low level while the electrical charge is discharged, and the determination means is configured to determine that the electrical charge should be discharged keeping the moving speed at the high level without causing the active gate control means to change the moving speed when the current flowing through the input and output terminals is smaller than a first specified value.

7. The drive circuit according to claim 6, wherein the determination means is configured to determine that the electrical charge should be discharged keeping the moving speed at the low level without causing the active gate control means to change the moving speed when the current flowing through the input and output terminals exceeds a second specified value larger than the first specified value.

8. The drive circuit according to claim 1, wherein the determination means is configured to variably set the change timing such that a rate of change of the current flowing through the input and output terminals is lower as the temperature of the switching element is lower during a transient period of an operating state of the switching element.

9. The drive circuit according to claim 1, wherein the active gate control means is configured to operate to change the moving speed from one of a high level and a low level to the other of the high level and the low level while the electrical charge is discharged, and the determination means is configured to determine that the electrical charge should be moved keeping the moving speed at the high level without causing the active gate control means to change the moving speed when the temperature exceeds a first specified temperature.

10. The drive circuit according to claim 9, wherein the determination means is configured to determine that the electrical charge should be moved keeping the moving speed at the low level without causing the active gate control means to change the moving speed when the temperature is below a second specified temperature lower than the first specified temperature.

11. The drive circuit according to claim 1, wherein the switching element is provided with a sense terminal from which a small current having a correlation with the current flowing through the input and output terminals thereof is outputted, and the determination means is configured to determine the change timing based on the small current outputted from the sense terminal.

* * * * *